(12) United States Patent
Kitazaki et al.

(10) Patent No.: US 9,076,820 B2
(45) Date of Patent: Jul. 7, 2015

(54) METHOD FOR MANUFACTURING SEMICONDUCTOR DEVICE AND SEMICONDUCTOR DEVICE

(75) Inventors: Soichiro Kitazaki, Mie-ken (JP); Masaru Kidoh, Mie-ken (JP); Mitsuru Sato, Mie-ken (JP); Ryota Katsumata, Mie-ken (JP); Tadashi Iguchi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 144 days.

(21) Appl. No.: 13/600,373

(22) Filed: Aug. 31, 2012

(65) Prior Publication Data

US 2013/0228852 A1 Sep. 5, 2013

(30) Foreign Application Priority Data

Feb. 28, 2012 (JP) .................. 2012-041993

(51) Int. Cl.
*H01L 27/115* (2006.01)
*H01L 29/66* (2006.01)
*H01L 29/78* (2006.01)

(52) U.S. Cl.
CPC ...... *H01L 29/66666* (2013.01); *H01L 29/7827* (2013.01); *H01L 27/11582* (2013.01); *H01L 27/11565* (2013.01)

(58) Field of Classification Search
CPC .................. H01L 27/11578; H01L 27/11582; H01L 29/792; H01L 29/7926; H01L 29/66833; H01L 21/28282; H01L 27/0688; H01L 27/11565; H01L 23/481; H01L 27/11551; H01L 27/11556; H01L 27/11573; H01L 29/42344

See application file for complete search history.

(56) References Cited

U.S. PATENT DOCUMENTS

| | | |
|---|---|---|
| 2010/0171162 A1 | 7/2010 | Katsumata et al. |
| 2010/0207190 A1 | 8/2010 | Katsumata et al. |
| 2010/0213537 A1 | 8/2010 | Fukuzumi et al. |
| 2010/0327340 A1 * | 12/2010 | Oota et al. ............... 257/324 |
| 2011/0057250 A1 | 3/2011 | Higashi |
| 2012/0241844 A1 | 9/2012 | Iguchi et al. |

FOREIGN PATENT DOCUMENTS

| | | |
|---|---|---|
| JP | 2010-161132 | 7/2010 |
| JP | 2010-192531 | 9/2010 |
| JP | 2010-199314 | 9/2010 |
| JP | 2010-225694 | 10/2010 |
| JP | 2011-54899 | 3/2011 |
| JP | 2012-204593 A | 10/2012 |

* cited by examiner

*Primary Examiner* — Minh-Loan Tran
*Assistant Examiner* — Leslie Pilar Cruz
(74) *Attorney, Agent, or Firm* — Oblon, McClelland, Maier & Neustadt, L.L.P.

(57) ABSTRACT

According to one embodiment, a method for manufacturing a semiconductor device includes forming a plurality of insulating isolation sections provided so as to extend in a first direction, isolate the stacked body in a second direction, and have a projection projecting from the stacked body. Each insulating isolation section has a side wall including recessed sections and projected sections repeated along the first direction. The method includes forming a sidewall film on a side wall of the projection of the insulating isolation section, and forming a plurality of first holes surrounded by the sidewall film and isolated by the sidewall film in the first direction, between the plurality of insulating isolation sections. The method includes forming a second hole in the stacked body provided under the first hole by etching with the insulating isolation section and the sidewall film used as a mask.

12 Claims, 15 Drawing Sheets

METHOD FOR MANUFACTURING SEMICONDUCTOR DEVICE AND SEMICONDUCTOR DEVICE

CROSS-REFERENCE TO RELATED APPLICATION

This application is based upon and claims the benefit of priority from Japanese Patent Application No. 2012-041993, filed on Feb. 28, 2012; the entire contents of which are incorporated herein by reference.

FIELD

Embodiments described herein relate generally to a method for manufacturing a semiconductor device and a semiconductor device.

BACKGROUND

There is a proposed memory device having a three-dimensional structure in which a memory hole is formed in a stacked body having electrode layers functioning as a control gate in a memory cell, and insulating layers which are alternately stacked, and a silicon body serving as a channel is provided on a side wall of the memory hole with a charge storage film interposed therebetween. A reduction in the number of manufacturing processes and a reduction in cost due to reducing an area are required in the memory device having the three dimensional structure, similar to a memory device having a two-dimensional structure.

DETAILED DESCRIPTION

Figure 1:
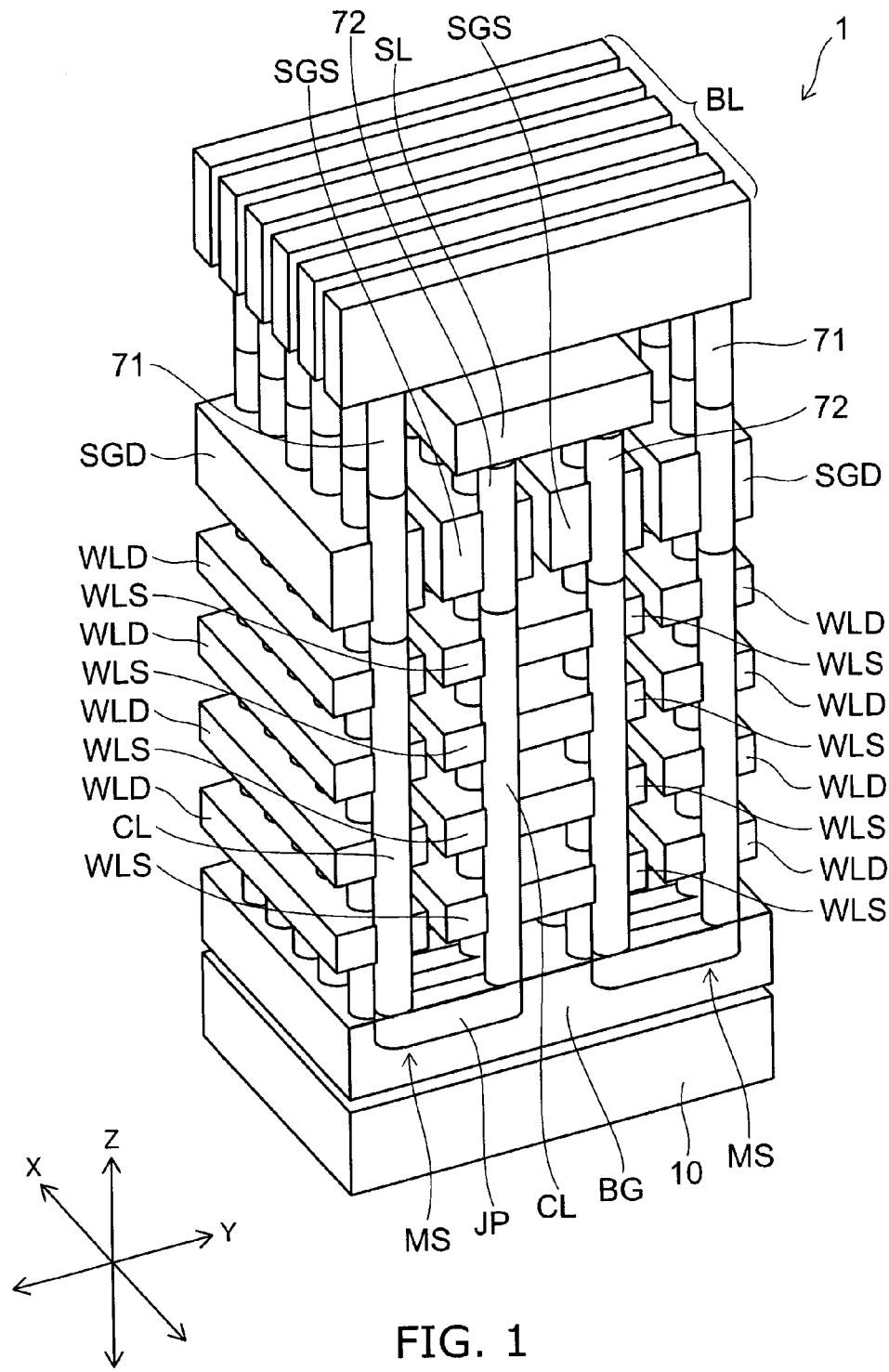
FIG. 1 is a schematic perspective view of a memory cell array of a semiconductor device of an embodiment.

According to one embodiment, a method for manufacturing a semiconductor device includes forming a stacked body including a plurality of electrode layers, on a substrate. The method includes forming a plurality of insulating isolation sections provided so as to extend in a first direction, isolate the stacked body in a second direction perpendicular to the first direction, and have a projection projecting from the stacked body. Each insulating isolation section has a side wall including recessed sections and projected sections repeated along the first direction in a planar view taken from a direction vertical to a main face of the substrate. The method includes forming a sidewall film on a side wall of the projection of the insulating isolation section, and forming a plurality of first holes surrounded by the sidewall film and isolated by the sidewall film in the first direction, between the plurality of insulating isolation sections. The method includes forming a second hole in the stacked body provided under the first hole by etching with the insulating isolation section and the sidewall film used as a mask.

Hereinafter, an embodiment will be described with reference to the drawings. In addition, in the drawings, the same reference is given to the same component.

FIG. 1 is a schematic perspective view of a memory cell array 1 in a semiconductor device of the embodiment. In addition, in FIG. 1, an insulating section is not shown to make it easy to see the drawing.

Figure 14A:
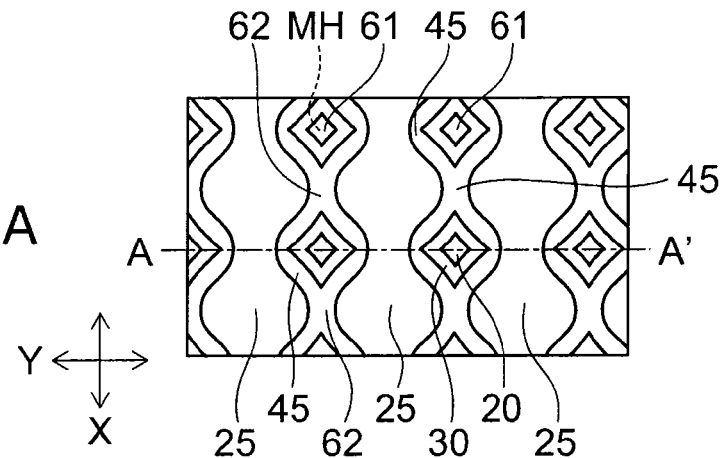
FIG. 14A is a schematic planar view showing a method for manufacturing the semiconductor device of the embodiment.
Figure 14B:
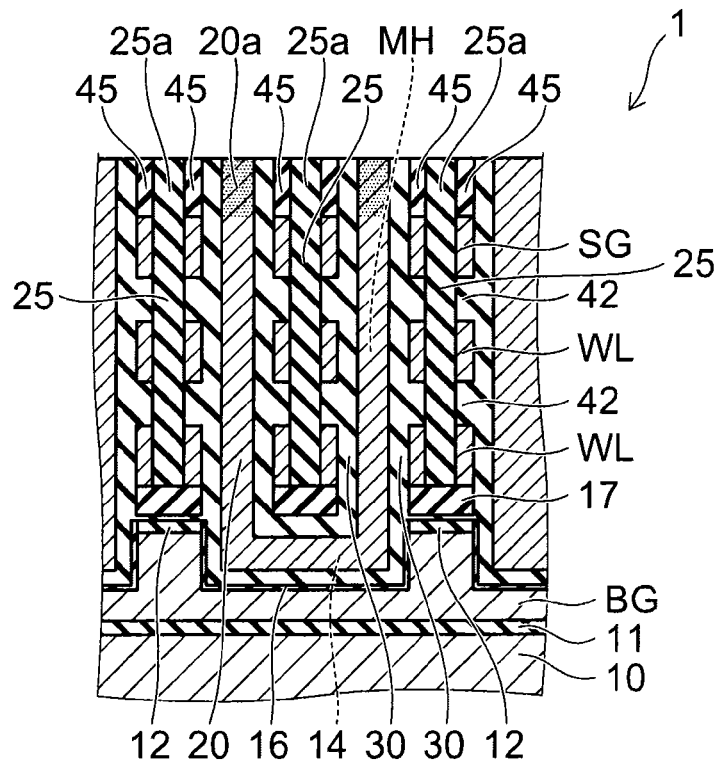
FIG. 14B is a cross-sectional view taken along a line A-A' in FIG. 14A.

FIG. 14B is a schematic cross-sectional view of the memory cell array 1.

Referring to FIG. 1, two directions which are parallel to a main face of a substrate 10, and intersect with each other are set as an X direction (first direction) and a Y direction (second direction), and a direction intersecting with each of the X direction and the Y direction is set as a Z direction (third direction or stacked direction).

In FIG. 1, electrode layers stacked under a drain-side select gate SGD are shown as WLD, and electrode layers stacked under a source-side select gate SGS are shown as WLS, but in other drawings, they are collectively shown as electrode layers WL without any distinction between them.

A back gate BG is provided on the main face of the substrate 10 with an insulating film 11 (shown in FIG. 14B)

interposed therebetween. The back gate BG may be formed as a conductive silicon layer containing an impurity.

Insulating layers 12 and 17 (shown in FIG. 14B) are provided on the back gate BG. A stacked body (first stacked body) including a plurality of electrode layers WL and a plurality of insulating layers 42 is provided on the insulating layer 17. The electrode layers WL and the insulating layers 42 are alternately stacked. The number of the electrode layers WL shown is only one example, and the number of the electrode layers WL is arbitrarily selected.

The electrode layer WL may be provided as a conductive silicon layer containing an impurity. The insulating layers 12, 17, and 42 may be formed of an insulating material containing a silicon oxide.

Referring to FIG. 1, the electrode layer WLD and the electrode layer WLS are isolated in the Y direction, and an insulating isolation section 25 (shown in FIG. 14B) is provided therebetween.

In addition, the electrode layers WLS provided between different memory strings MS adjacent to each other in the Y direction are also isolated in the Y direction, and the insulating isolation section 25 is provided therebetween. Furthermore, the electrode layers WLD provided between the different memory strings MS adjacent to each other in the Y direction are also isolated in the Y direction, and the insulating isolation section 25 is provided therebetween.

The electrode layers WLD are provided between the back gate BG and the drain-side select gate SGD. The electrode layers WLS are provided between the back gate BG and the source-side select gate SGS.

In addition, in the drawings other than FIG. 1, the drain-side select gate SGD and the source-side select gate SGS are collectively shown as the select gates SG without any distinction between them.

The drain-side select gate SGD is provided on the uppermost electrode layer WLD with the insulating layer 42 (shown in FIG. 14B) interposed therebetween. The drain-side select gate SGD may be formed as a conductive silicon layer containing an impurity.

The source-side select gate SGS is provided on the uppermost electrode layer WLS with the insulating layer 42 (shown in FIG. 14B) interposed therebetween. The source-side select gate SGS may be formed as a conductive silicon layer containing an impurity.

As shown in FIG. 1, a source line SL is provided on the source-side select gate SGS. The source line SL may be formed as a metal layer. Bit lines BL serving as a plurality of metal interconnections are provided on the drain-side select gate SGD and the source line SL. Each bit line BL extends in the Y direction.

The drain-side select gate SGD and the source-side select gate SGS are isolated in the Y direction, and the insulating isolation section 25 (shown in FIG. 14B) is provided therebetween.

In addition, the source-side select gate SGS provided between the different memory strings MS adjacent to each other in the Y direction are also isolated in the Y direction, and the insulating isolation section 25 is provided therebetween. Furthermore, the drain-side select gate SGD provided between the different memory strings MS adjacent to each other in the Y direction are also isolated in the Y direction, and the insulating isolation section 25 is provided therebetween.

As shown in FIG. 14B, a sidewall film 45 is provided on the select gate SG. The insulating isolation section 25 which isolates the select gate SG and the stacked body provided under it in the Y direction extends and projects from the select gate SG. The sidewall film 45 is provided on a side wall of a projection 25a of the insulating isolation section 25. That is, one paired sidewall films are provided so as to sandwich the one insulation isolation section 25 in the Y direction.

The insulating isolation section 25 has a structure in which an insulating material is buried in a groove as will be described later, and the insulating material includes a silicon oxide, silicon nitride, aluminum oxide, hafnium oxide, and hafnium aluminate.

The sidewall film 45 may be formed of a silicon oxide, silicon nitride, aluminum oxide, hafnium oxide, and hafnium aluminate similar to the insulating isolation section 25.

As shown in a top view in FIG. 14A, the insulating isolation sections 25 are arranged in the Y direction (second direction). The respective insulating isolation sections 25 extend in the X direction (first direction). The X direction and the Y direction intersect (orthogonal in the embodiment) with each other in a plane parallel to the main face of the substrate 10.

The plurality of insulating isolation sections 25 isolates a second stacked body including the sidewall film 45 and the select gate SG, and the first stacked body including the plurality of electrode layers WL and the plurality of insulating layers 42, in the Y direction.

Each of the insulating isolation sections 25 has a side wall having a concave section and a convex section repeated along the X direction in the planar view (top view) shown in FIG. 14A taken from a direction perpendicular to the main face of the substrate 10. According to the example shown in FIG. 14A, the side wall of the insulating isolation section 25 is formed into a curved shape or wavy shape along the X direction.

The convex sections are opposed to each other and the concave sections are opposed to each other of the side walls between the adjacent insulating isolation sections 25. Here, the convex section is projected from a center of the insulating isolation section 25 in the Y direction toward outside in the Y direction, and the concave section is recessed toward the center of the insulating isolation section in the Y direction.

A first region 61 and a second region 62 are alternately laid out in the X direction between the adjacent insulating isolation sections 25. FIG. 14B shows a cross-sectional view taken along a line A-A' in a section including the first region 61 in FIG. 14A.

The first region 61 is formed between the concave sections of the side walls of the adjacent insulating isolation sections 25, and the second region 62 is formed between the convex sections of the side walls of the adjacent insulating isolation sections 25. A width of the first region 61 in the Y direction (distance between the convex sections of the side walls) is larger than a width of the second region 62 in the Y direction (distance between the convex sections of the side walls).

A memory hole MH is formed under the first region 61. The memory hole MH is surrounded by the sidewall film 45 between the insulating isolation sections 25, and isolated by the sidewall film 45 in the X direction. The second region 62 on the select gate SG is filled with the sidewall film 45.

A channel body 20 is provided in the memory hole MH. The channel body 20 may be formed as a silicon film. A memory film 30 is provided between the channel body 20 and inner walls (a side wall and a bottom wall) of the memory hole MH.

Figure 2:
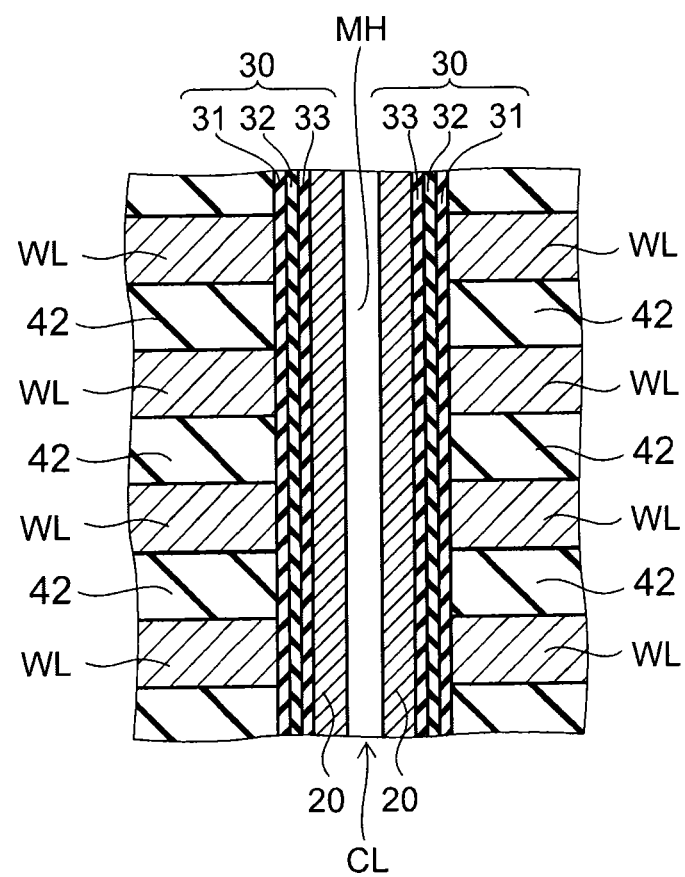
FIG. 2 is a schematic sectional view of a portion in which memory cells of the semiconductor device of the embodiment are stacked.

FIG. 2 is a cross-sectional view of a section in which the memory hole MH penetrates the first stacked body composed of the alternately stacked electrode layers WL and insulating layers 42.

The memory film 30 includes a block film 31 serving as a first insulating film, a charge storage film 32, and a tunnel film 33 serving as a second insulating film.

The block film 31, the charge storage film 32, and the tunnel film 33 are sequentially provided between the electrode layer WL and the channel body 20, from the side of the electrode layer WL. The block film 31 is in contact with the electrode layer WL, the tunnel film 33 is in contact with the channel body 20, and the charge storage film 32 is provided between the block film 31 and the tunnel film 33.

The channel body 20 is formed into a shape of tube, and a void is formed around a center axis in the memory hole MH. Alternatively, the memory hole MH around the center axis may be completely filled with the channel body 20.

The channel body 20 functions as a channel in the memory cell (transistor), and the electrode layer WL functions as a control gate, and the charge storage film 32 functions as a data memory layer to store the charges injected from the channel body 20. That is, the memory cell having a structure in which the control gate surrounds a periphery of the channel is formed in an intersection part between the channel body 20 and each electrode layer WL.

The semiconductor device of the embodiment is a nonvolatile semiconductor memory device capable of being free to electrically erase/program data and holding memory contents even after a power supply is turned off.

The memory cell is a charge-trap type memory cell. The charge storage film 32 has many trap sites for trapping the charges, and may be formed as a silicon nitride film.

The tunnel film 33 may be formed as a silicon oxide film, and serves as a potential barrier when the charges are injected from the channel body 20 to the charge storage film, or when the charges stored in the charge storage film 32 are diffused to the channel body 20.

The block film 31 may be formed as a silicon oxide film, and prevents the charges stored in the charge storage film 32 from diffusing to the electrode layer WL.

The drain-side select gate SGD, the channel body 20, and the memory film 30 provided therebetween constitute a drain-side selector transistor. The source-side select gate SGS, the channel body 20, and the memory film 30 provided therebetween constitute a source-side selector transistor. The back gate BG, and the channel body 20 and the memory film 30 provided in the back gate BG constitute a back gate transistor.

The memory cells each having the electrode layer WLD serving as the control gate are provided between the drain-side selector transistor and the back gate transistor. Similarly, the memory cells each having the electrode layer WLS serving as the control gate are provided between the back gate transistor and the source-side selector transistor.

The plurality of memory cells, the drain-side selector transistor, the back gate transistor, and the source-side selector transistor are connected in series through the channel body 20, and constitute the one U-shaped memory string MS.

The one memory string MS has a pair of column-shaped sections CL extending in the stacked direction (Z direction) of the stacked body including the electric layers WL, and a connection section JP buried in the back gate BG to connect lower ends of the pair of column-shaped sections CL. The plurality of memory strings MS are arranged in the X direction and the Y direction, whereby the plurality of memory cells are arranged in the X direction, the Y direction, and the Z direction three-dimensionally.

As shown in FIG. 1, an upper end of the column-shaped section CL which penetrates the drain-side select gate SGD and the electrode layers WLD is connected to the bit line BL through a contact section 71. An upper end of the column-shaped section CL which penetrates the source-side select gate SGS and the electrode layers WLS is connected to the source line SL through a contact section 72.

In the semiconductor device of the embodiment, an erasing operation of the data is performed such that electrons are pulled out of the charge storage film 32, or holes are injected into the charge storage film 32. The transistor including the memory cell having the electrode layer WL serving as the control gate takes a state (erased state) in which a threshold voltage is relatively low, and a state (programmed state) in which the threshold voltage of the memory cell is relatively high. Thus, the erasing operation is performed such that the threshold voltage of the memory cell is set to the lower side.

According to a general memory having a two-dimensional structure, the electrons programmed in a floating gate are pulled out by raising a substrate potential. However, as for the semiconductor device having the three-dimensional structure according to the embodiment, the channel of the memory cell is not directly connected to the substrate. Therefore, there is a proposed method in which a channel potential of the memory cell is boosted by making use of a GIDL (Gate Induced Drain Leakage) current generated in a channel at an end of the select gate SG.

That is, by applying a high voltage to a diffusion region which is formed in the channel body 20 in a neighborhood of an upper end of the select gate SG and contains an impurity at high concentration, a high electric field is generated in a depletion layer formed between the select gate SG and the diffusion region. Thus, interband tunneling is caused, and the generated holes are supplied to the channel body 20, whereby the channel potential increases. When the potential of the electrode layer WL is brought to the ground potential (0V), the electrons are pulled out of the charge storage film 32, or the holes are injected into the charge storage film 32 due to a potential difference between the channel body 20 and the electrode layer WL, whereby the erasing operation is performed.

To perform the erasing operation at higher speed, it is required to provide a diffusion region containing an impurity at high concentration in the channel body 20 in the neighborhood of the upper end of the select gate SG. FIG. 14B schematically shows a region 20a containing an impurity at a concentration higher than the channel body 20 of the memory cell as a dot pattern.

Next, a description will be given of a method for manufacturing the memory cell array in the semiconductor device of the embodiment with reference to FIGS. 3A to 14B. In each drawing, A shows a planar view (top view) taken from a direction perpendicular to the main face of the substrate 10, and B shows a cross-sectional view taken along a line A-A' in A.

Figure 3A:
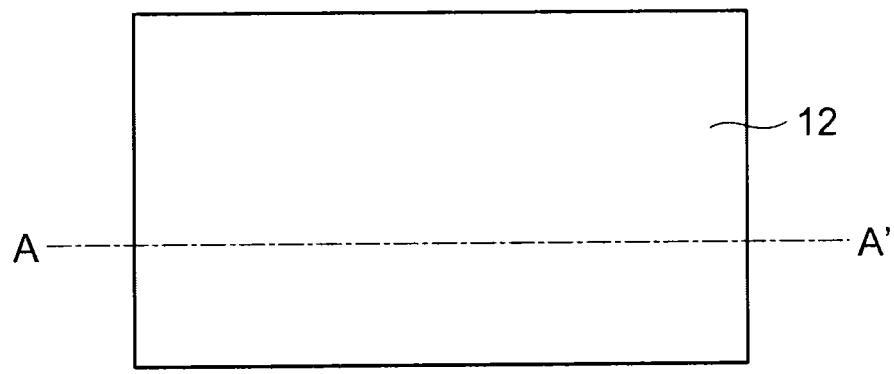
FIG. 3A is a schematic planar view showing a method for manufacturing the semiconductor device of the embodiment.
Figure 3B:
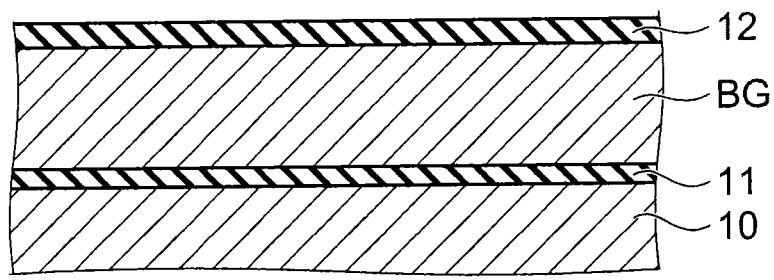
FIG. 3B is a cross-sectional view taken along a line A-A' in FIG. 3A.

As shown in FIG. 3B, the insulating film (such as a silicon oxide film) 11 is formed on the substrate (such as a silicon substrate) 10, and the silicon layer is formed on the insulating film 11 as the back gate BG. Furthermore, the insulating layer (such as the silicon oxide film) 12 is formed on the back gate BG.

Figure 4A:
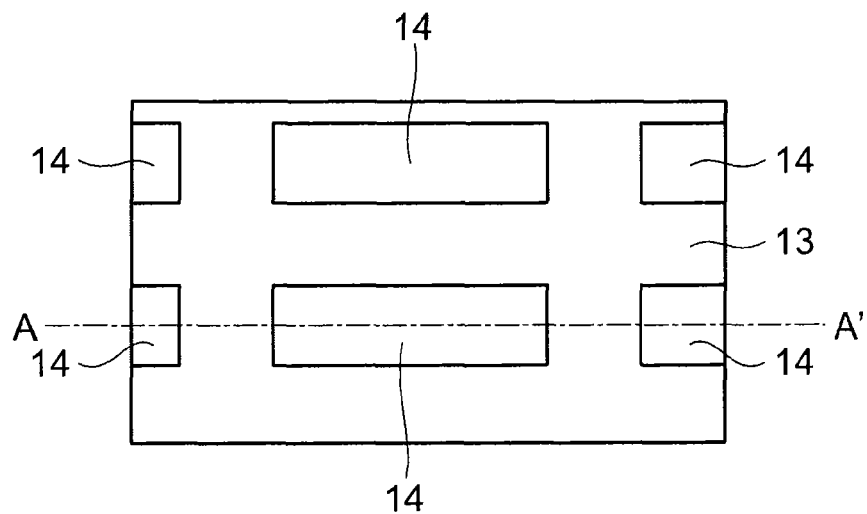
FIG. 4A is a schematic planar view showing a method for manufacturing the semiconductor device of the embodiment.
Figure 4B:
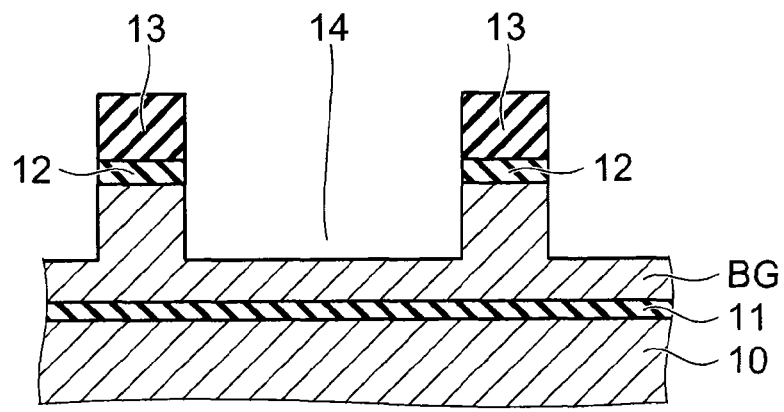
FIG. 4B is a cross-sectional view taken along a line A-A' in FIG. 4A.

The insulating layer 12 and the back gate BG are processed by a RIE (Reactive Ion Etching) method using a resist 13 as a mask as shown in FIG. 4B. Thus, a groove 14 is formed in the back gate BG.

Figure 5A:
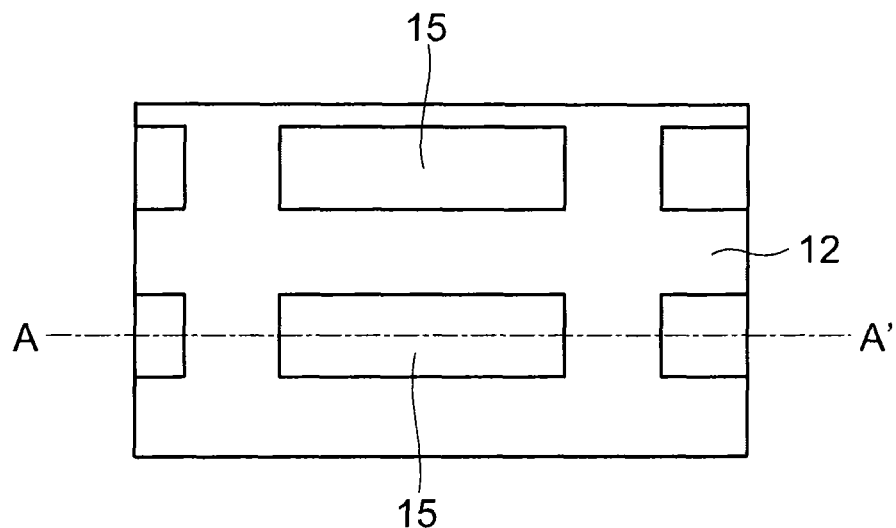
FIG. 5A is a schematic planar view showing a method for manufacturing the semiconductor device of the embodiment.
Figure 5B:
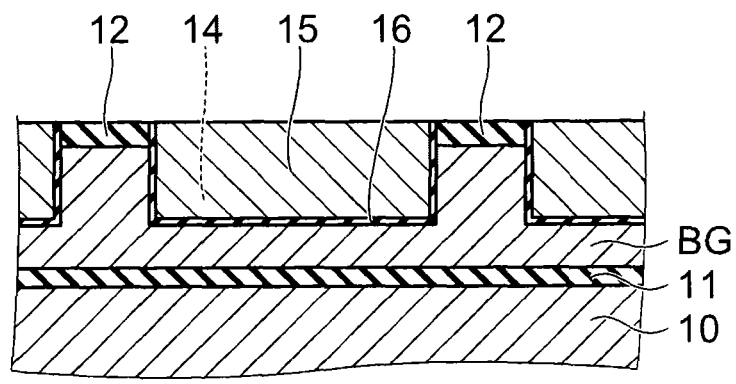
FIG. 5B is a cross-sectional view taken along a line A-A' in FIG. 5A.

Then, an insulating film 16 shown in FIG. 5B is formed on a surface (silicon surface) of the back gate BG exposed to a side wall and a bottom wall of the groove 14. The insulating film 16 is a silicon oxide film formed by a RTO (Rapid Thermal Oxidation) method.

Then, an undoped amorphous silicon film is deposited as a sacrifice film 15 by a LPCVD (Low Pressure Chemical Vapor Deposition) method, and then the sacrifice film 15 is etched using the insulating layer 12 formed on a top face of a convex section of the back gate BG as a stopper (FIG. 5B). The insulating layer 12 and the sacrifice film 12 are almost uniformly flattened.

Figure 6A:
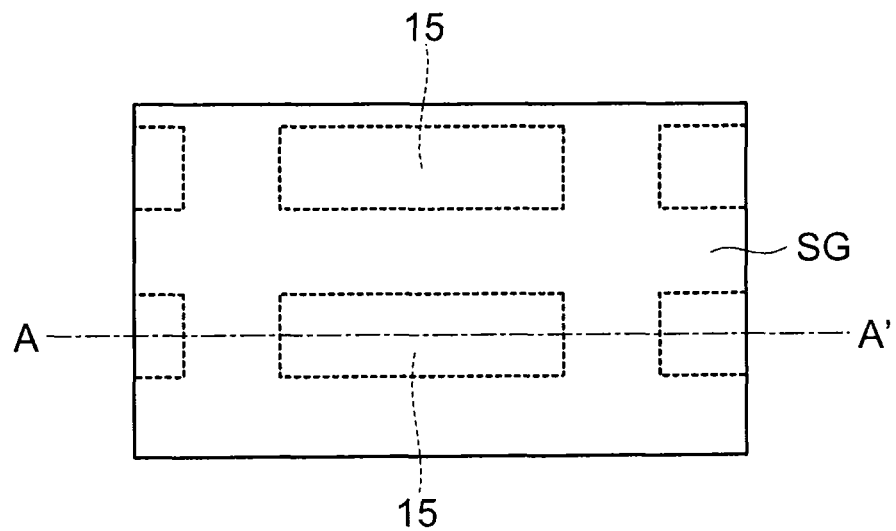
FIG. 6A is a schematic planar view showing a method for manufacturing the semiconductor device of the embodiment.
Figure 6B:
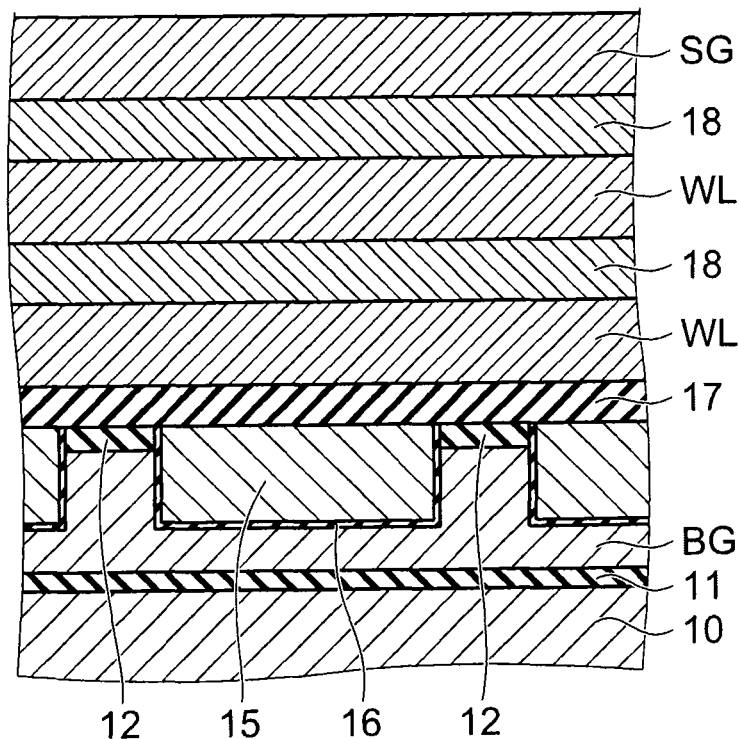
FIG. 6B is a cross-sectional view taken along a line A-A' in FIG. 6A.

As shown in FIG. 6B, the insulating layer (such as the silicon oxide film) 17 is formed on the insulating layer 12 and the sacrifice film 15 by a PCVD (Plasma Chemical Vapor Deposition) method. Then, amorphous silicon layers containing boron as an impurity and the undoped amorphous silicon layers 18 are alternately and plurally stacked on the insulating layer 17. Among the plurality of amorphous silicon layers containing the boron, an uppermost layer is the select gate SG, and the layers provided under the selector data SG are the electrode layers WL. The undoped amorphous silicon layer 18 is finally replaced with the interelectrode insulating layer 42 shown in FIG. 14B in a process which will be described later.

Figure 7A:
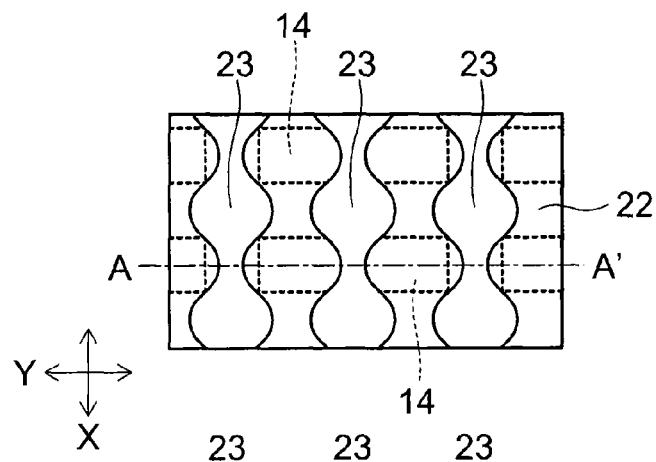
FIG. 7A is a schematic planar view showing a method for manufacturing the semiconductor device of the embodiment.
Figure 7B:
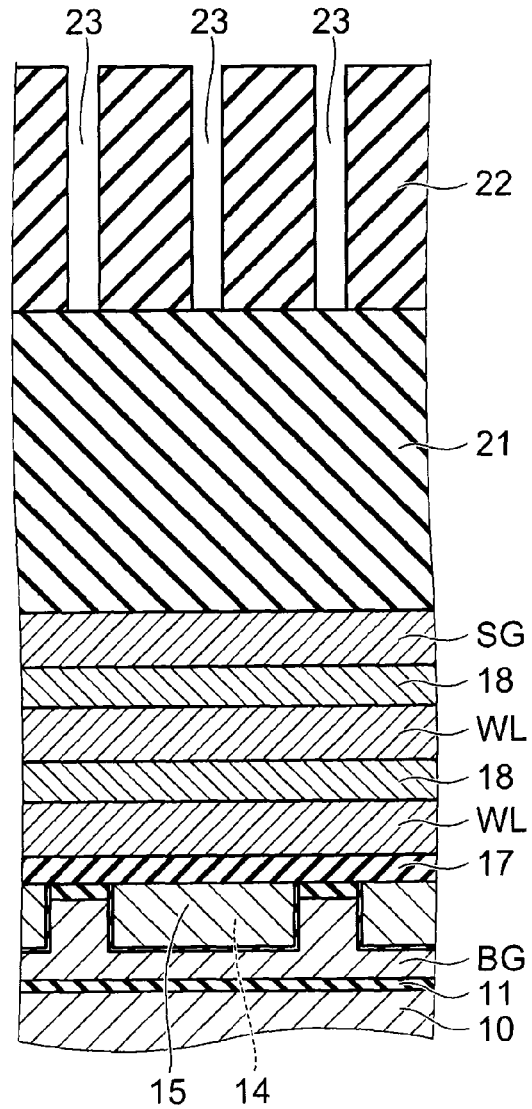
FIG. 7B is a cross-sectional view taken along a line A-A' in FIG. 7A.

A sacrifice layer 21 shown in FIG. 7B is formed on the select gate SG. The sacrifice layer 21 may be formed as a silicon oxide film containing boron (BSG: Boron Silicate Glass).

Furthermore, a resist film 22 is formed on the sacrifice layer 21, and a plurality of slits 23 are formed on the resist film 22 by a photolithography method. Each slit 23 are positioned with respect to the groove 14 formed in the back gate BG.

FIG. 7A shows a planar pattern of the slits 23.

Each slit 23 extends in the X direction. A side wall of each slit 23 is formed into a shape in which a concave section and a convex section are repeated in a shape of a curved line along the X direction in a planar view in FIG. 7A. Each slit 23 has the section relatively small in width and the section relatively large in width in the Y direction, and the sections small in width and the sections large in width are alternately arranged in the X direction.

The sacrifice layer 21 is etched by the RIE method using the resist film 22 as a mask. Then, the resist film 22 is removed, and the stacked body under the sacrifice layer 21 is etched by the RIE method using the sacrifice layer 21 as a mask.

Figure 8A:
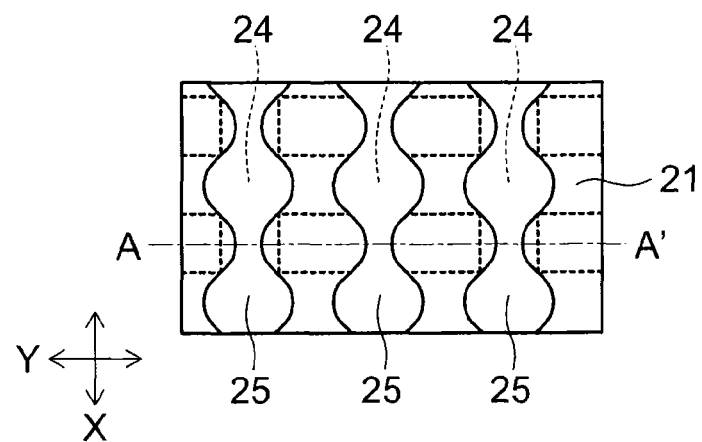
FIG. 8A is a schematic planar view showing a method for manufacturing the semiconductor device of the embodiment.
Figure 8B:
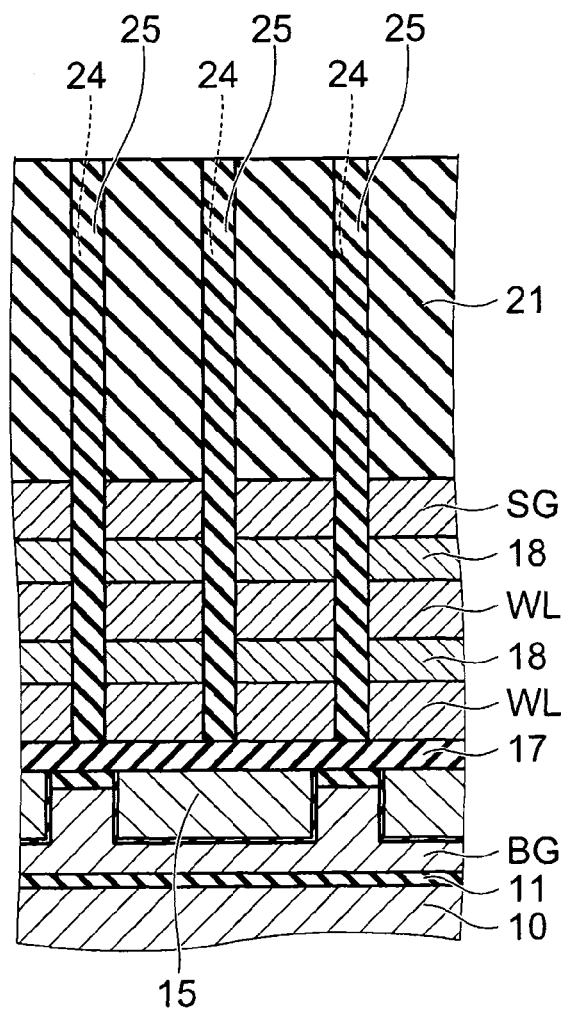
FIG. 8B is a cross-sectional view taken along a line A-A' in FIG. 8A.

By the above etching, a groove 24 reaching the insulating layer 17 is formed in the sacrifice layer 21 and the stacked body provided under it as shown in FIG. 8B, and the groove 24 is filled with an insulating film. Thus, the insulating isolation section 25 is formed so as to isolate the stacked body into several parts in the Y direction.

The insulating isolation section 25 extends in the X direction. A side wall of each insulating isolation section 25 is formed into the shape in which a concave section and a convex section are repeated in a shape of a curved line along the X direction in a planar view in FIG. 8A. Each insulating isolation section 25 has the section relatively small in width and the section relatively large in width in the Y direction, and the sections small in width and the sections large in width are alternately arranged in the X direction.

Figure 9A:
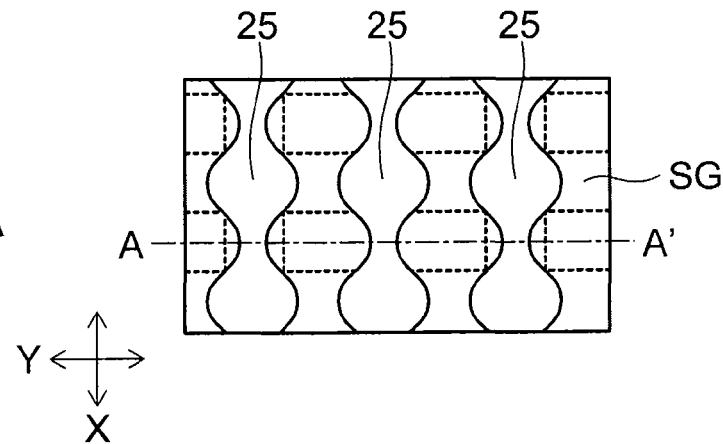
FIG. 9A is a schematic planar view showing a method for manufacturing the semiconductor device of the embodiment.
Figure 9B:
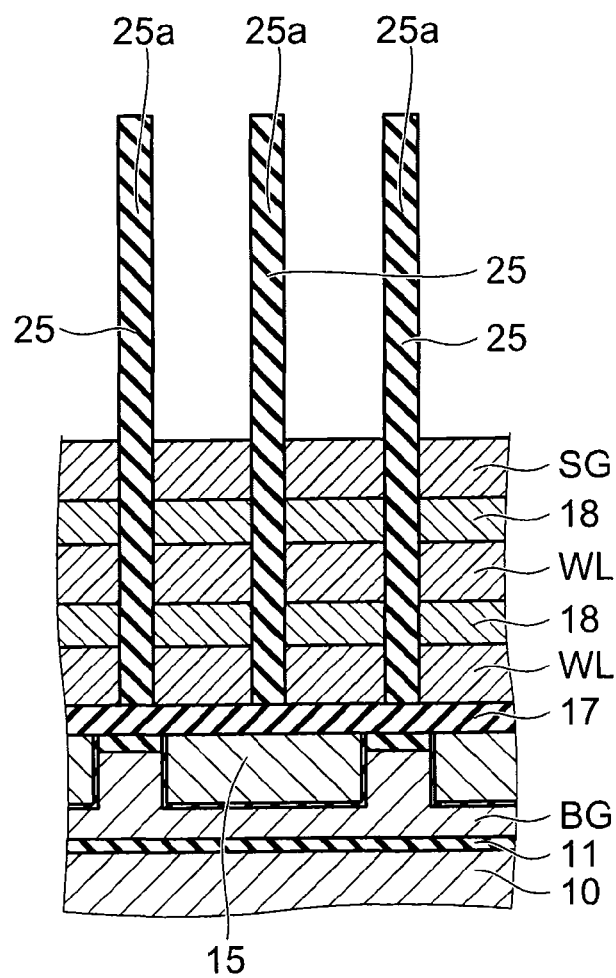
FIG. 9B is a cross-sectional view taken along a line A-A' in FIG. 9A.

After the groove 24 has been filled with the insulating film, the insulating film on the sacrifice layer 21 is removed by dry etching or a CMP (Chemical Mechanical Polishing) method. Then, the sacrifice layer 21 is removed by a VPC (Vapor Phase Cleaning) method, whereby a structure shown in FIG. 9B is provided. That is, the insulating isolation section 25 has the projection 25a projecting from the stacked body.

Figure 10A:
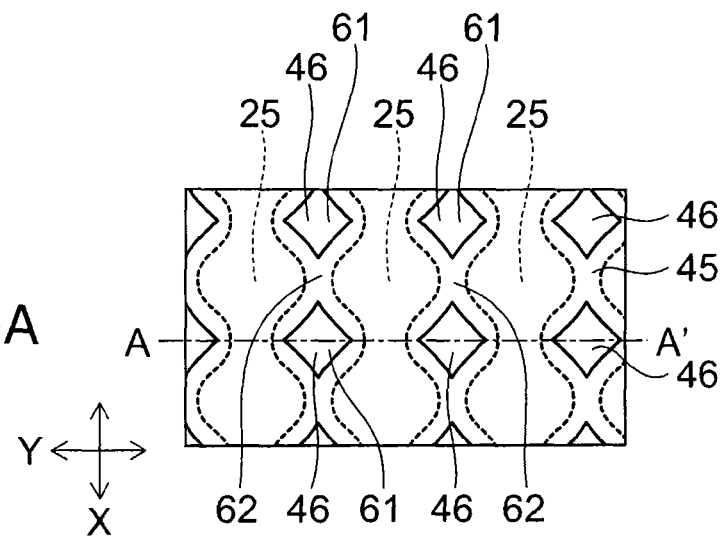
FIG. 10A is a schematic planar view showing a method for manufacturing the semiconductor device of the embodiment.
Figure 10B:
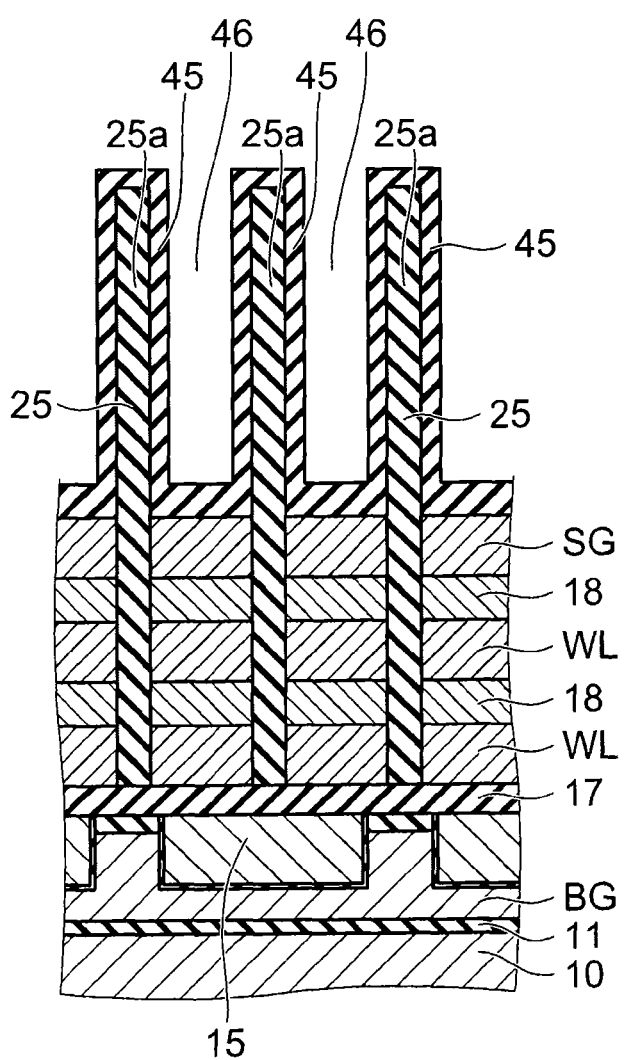
FIG. 10B is a cross-sectional view taken along a line A-A' in FIG. 10A.

The sidewall film 45 is formed on the side wall of the projection 25a of the insulating isolation section 25 by the LPCVD method as shown in FIGS. 10A and 10B. The sidewall film 45 is formed conformally along a top face of the stacked body, and a side wall and a top face of the projection 25a of the insulating isolation section 25.

The side wall of the insulating isolation section 25 is formed into the shape in which the concave section and the convex section are repeated along the X direction in the shape of the curved line. Therefore, the first region 61 and the second region 62 having the width smaller than that of the first region 61 in the Y direction are alternately arranged in the X direction between the insulating isolation sections 25 adjacent to each other in the Y direction.

A first hole 46 is formed in the first region 61, and the second region 62 is filled with the sidewall film 45. Therefore, the first hole 46 and the region filled with the sidewall film 45 are alternately formed in the X direction between the adjacent insulating isolation sections 25.

The first hole 46 is surrounded by the sidewall film 45 between the adjacent insulating isolation sections 25, and isolated by the sidewall film 45 in the X direction.

By making a distance between the side walls of the insulating isolation section 25 in the second region 62 smaller than two times of a film thickness of the sidewall film 45 formed on the side wall of the insulating isolation section 25 in the first region 61, the first hole 46 is formed in the first region 61 while the second region 62 can be closed by the sidewall film 45.

Figure 11A:
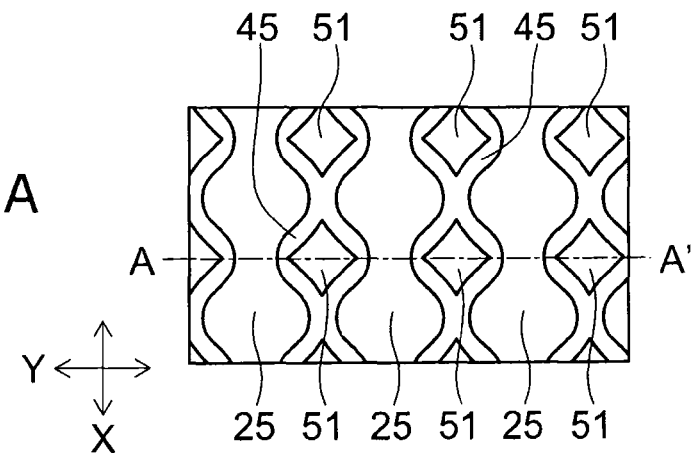
FIG. 11A is a schematic planar view showing a method for manufacturing the semiconductor device of the embodiment.
Figure 11B:
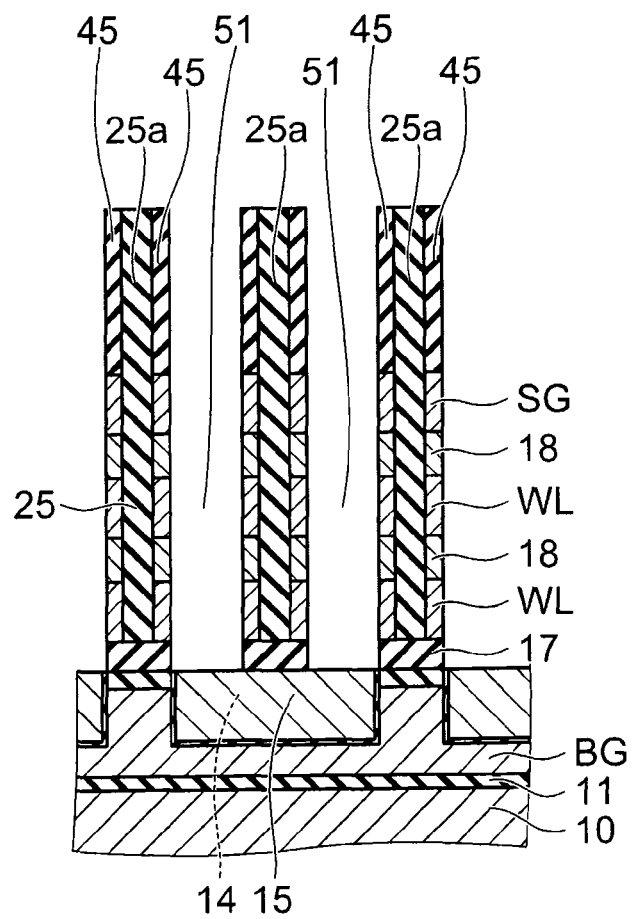
FIG. 11B is a cross-sectional view taken along a line A-A' in FIG. 11A.

The insulating isolation section 25 and the sidewall film 45 are made of the material different from the silicon layer of the stacked body, and may be formed as a silicon oxide film, silicon nitride film, aluminum oxide film, hafnium oxide film, or hafnium aluminate film. Thus, a second hole 51 shown in FIGS. 11A and 11B is formed in the stacked body provided under the first hole 46, by the RIE method, using the insulating isolation section 25 and the sidewall film 45 as a mask.

A lower end of the second hole 51 reaches the sacrifice film 15 buried in the groove 14 of the back gate BG, and the sacrifice film 15 is exposed to a bottom of the second hole 51. The pair of second holes 51 is formed for the one groove 14.

Figure 12A:
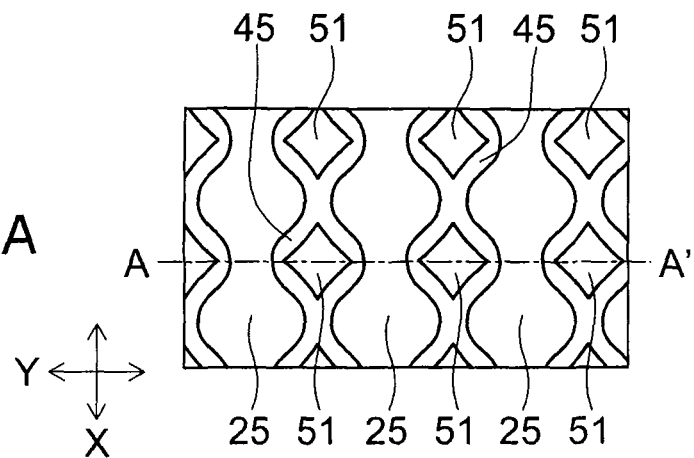
FIG. 12A is a schematic planar view showing a method for manufacturing the semiconductor device of the embodiment.
Figure 12B:
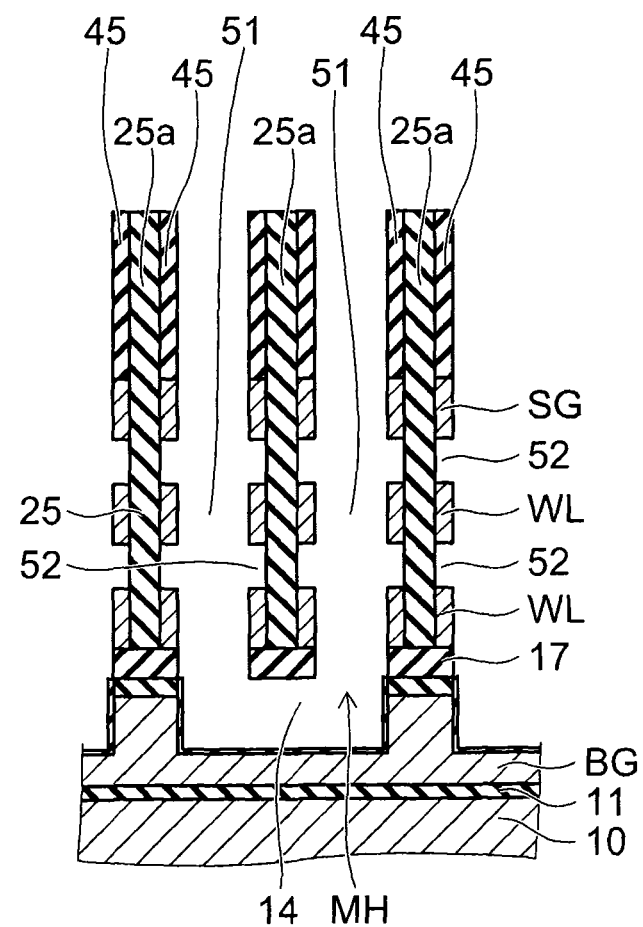
FIG. 12B is a cross-sectional view taken along a line A-A' in FIG. 12A.

After the second hole 51 has been formed, the sacrifice film 15 formed of undoped silicon is removed by a wet etching method. Thus, the sacrifice film 15 is removed as shown in FIG. 12B. In addition, the undoped silicon layer 18 between the electrode layers WL is also removed through the second hole 51, and a space 52 is formed between the electrode layers WL.

The back gate BG, the electrode layer WL, and select gate SG are made of the material different from that of the sacrifice film 15 and the undoped silicon layer 18, so that they are not removed at the time of the above etching.

By removing the sacrifice film 15, the groove 14 is formed in the back gate BG as shown in FIG. 12B. The lower ends of the pair of second holes 51 are connected to the one groove 14. That is, the lower ends of the pair of second holes 51 are connected to the one common groove 14, so that the one U-shaped memory hole MH is formed.

Figure 13A:
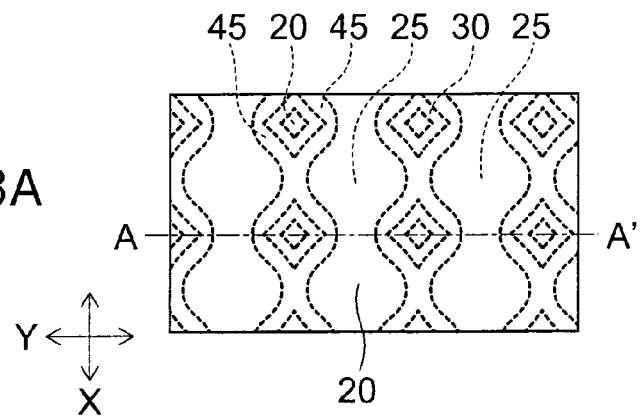
FIG. 13A is a schematic planar view showing a method for manufacturing the semiconductor device of the embodiment.
Figure 13B:
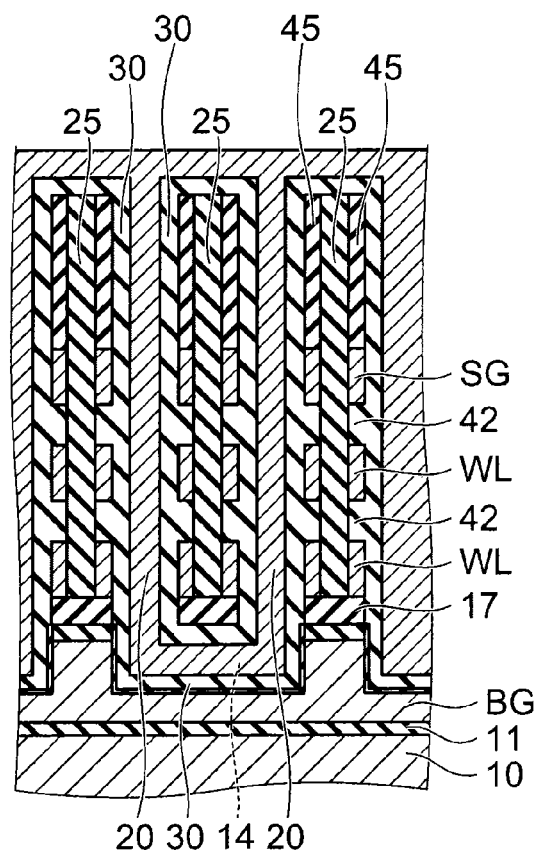
FIG. 13B is a cross-sectional view taken along a line A-A' in FIG. 13A.

After the memory hole MH has been formed, the insulating layer 42 is formed between the electrode layers WL as shown in FIG. 13B, and the above-described memory film 30 is formed on the inner wall of the memory hole MH.

In addition, the channel body 20 is formed on the side wall of the memory film 30. In addition, the channel body 20 is also formed on the inner side of the memory film 30 in the groove 14 of the back gate BG.

After that, the upper surface of the stacked body obtained from the above processes until FIGS. 13A and 13B is removed to a middle of the sidewall film 45 by the CMP (Chemical Mechanical Polishing) method or an etching-back method as shown in FIG. 14B.

The sidewall film 45 is left on the select gate SG. That is, the sidewall film 45 which served as the mask at the time of forming the second hole 51 is partially left between the insulating isolation section 25 and the memory film 30 above the select gate SG. The sidewall film 45 functions as an interlayer insulating film which insulates the select gate SG with interconnections provided above it.

According to the embodiment described in the above, as shown in FIGS. 10A and 10B, the insulating isolation section 25 which isolates the stacked body including the plurality of electrode layers WL is partially projected from the stacked body. Then, the sidewall film 45 is formed on the side wall of the projection 25a, and the stacked body is etched using the insulating isolation section 25 and the sidewall film 45 as the mask.

By forming the sidewall film 45, the first hole 46 is formed above the stacked body, and by etching the stacked body with the insulating isolation section 25 and the sidewall film 45 used as the mask, the memory hole is formed in the stacked body under the first hole 46. That is, it is not necessary to provide a process for newly forming a mask by the lithography in order to form the memory hole.

At the time of forming the insulating isolation section 25 and the memory hole in the stacked body, the process for patterning the resist film 22 shown in FIGS. 7A and 7B is only required as the process for forming the mask by the lithography. Thus, there is a reduction in cost due to simplification of the process.

In addition, when the insulating isolation section 25 and the memory hole are formed with different masks as a comparison example, the insulating isolation section 25 and the memory hole are likely to be out of alignment caused by a degree of precision of the lithography. Therefore, a distance between the insulating isolation section 25 and the memory hole needs to be set in view of being out of alignment due to the photolithography, which prevents the cell size (size in a planar direction) from reducing.

Meanwhile, according to the embodiment, the positioning of the memory hole is performed in a self-alignment manner with respect to the insulating isolation section 25 and the sidewall film 45 formed on the side wall thereof. By keeping a film thickness of the sidewall film 45 formed in the first region 61 constant, the distance between the memory hole and the insulating isolation section 25 can be controlled with high precision without being influenced by the precision of the lithography. Therefore, the process can be simple while the cell size is prevented from increasing.

In the above-described embodiment, before the memory film 30 is formed, a natural oxide film formed on the side wall of the electrode layer WL can be removed in order to improve the characteristics of the memory cell.

As a treatment at this time, a rare hydrofluoric acid treatment may be used, but a rare hydrofluoric acid melts the silicon oxide. Therefore, in the case where the rare hydrofluoric acid treatment is performed before the memory film 30 is formed, it is desired that the sidewall film 45 and the insulating isolation section 25 are formed of a material showing etching resistance to the rare hydrofluoric acid to be a silicon nitride film, aluminum oxide film, hafnium oxide film, or hafnium aluminate film.

The silicon nitride film, aluminum oxide film, hafnium oxide film, and hafnium aluminate film are insulating films whose permittivity is higher than that of the silicon oxide film. Therefore, when the sidewall film 45 is formed of the above material, the insulating sidewall film 45 containing many fixed charges compared with the silicon oxide is provided between the memory film 30 and the insulating isolation section 25 above the select gate SG as shown in FIG. 14B.

Thus, due to an influence of the fixed charges contained in the sidewall film 45, the threshold value of the drain-side selector transistor and the source-side selector transistor can be shifted and reach desirable values. In addition, the fixed charges contained in the sidewall film 45 are expected to provide an effect of assisting the generation of the above-described GIDL.

Figure 15A:
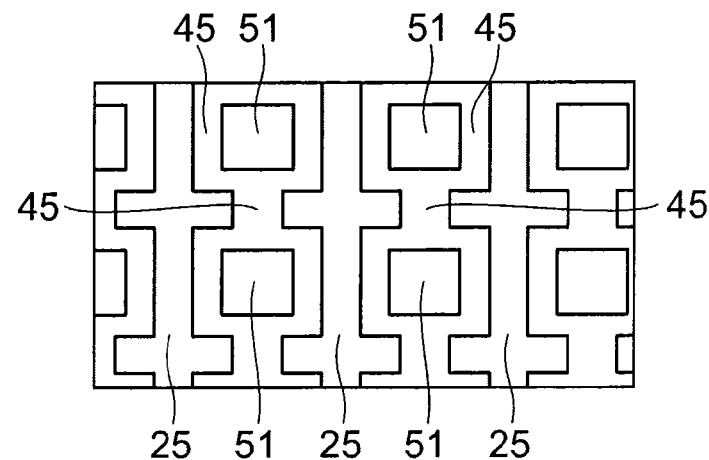
FIGS. 15A to 15C are schematic planar views showing other examples of planar patterns of an insulating isolation section of the semiconductor device of the embodiment.
Figure 15B:
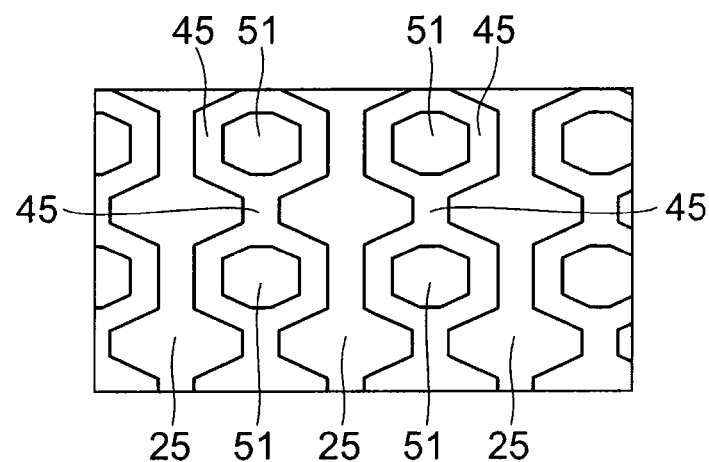
Figure 15C:
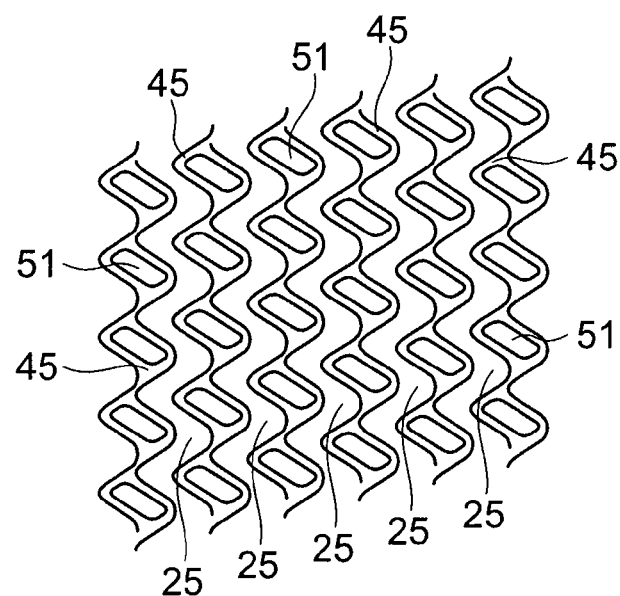

FIGS. 15A to 15C are schematic planar view corresponding to FIG. 11A in the above-described embodiment, and show other specific examples of planar patterns of the insulating isolation section 25.

Each of FIGS. 15A and 15B shows a specific example in which a side wall of the insulating isolation section 25 is composed of rectangular concavo-convex sections repeated in the X direction in a planar view.

According to the specific example shown in FIG. 15A, a planar shape of the first hole 51 and the memory hole formed under it is formed into a quadrangular shape. According to the specific example shown in FIG. 15B, a planar shape of the memory hole is a polygonal shape.

According to the specific examples in FIGS. 15A and 15B, a surface area of the side wall of the memory hole can be easily increased, so that a charge storage amount of the memory cell can be increased, and reliability can be improved.

In general, a curved pattern edge can be easily formed by the lithography, and a rectangular pattern edge as shown in FIGS. 15A and 15B can be formed with high precision by an imprint technique.

FIG. 15C shows a pattern in which the insulating isolation section 25 extends in the X direction in a wavy shape. While a center line passing through a center in the Y direction in the insulating isolation section 25 linearly extends in the X direction in the pattern shown in FIG. 11A, a center line passing through a center in the Y direction in the insulating isolation section 25 is curved in FIG. 15A.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A semiconductor device comprising:
a substrate;
a first stacked body having a plurality of electrode layers and a plurality of insulating layers alternately stacked on the substrate;
a second stacked body including a select gate provided on the first stacked body;
a plurality of insulating isolation sections provided so as to extend in a first direction, and isolate the first stacked body and the second stacked body in a second direction perpendicular to the first direction, in which each of the insulating isolation sections has a side wall having recessed sections and projected sections repeated along the first direction in a planar view taken from a direction vertical to a main face of the substrate;
a first channel body provided in a first hole penetrating the second stacked body and the first stacked body;

a first memory film including a first charge storage film provided between the first channel body and a side wall of the first hole; and an insulating sidewall film provided between the first memory film and each of the insulating isolation sections above the select gate, the insulating sidewall film extending along the first direction in a planar view taken from the direction vertical to the main face of the substrate, a permittivity of the insulating sidewall film being higher than a permittivity of a silicon oxide film, the first channel body having a column-shaped section provided under a region surrounded by the insulating sidewall film between the plurality of insulating isolation sections, and isolated by the insulating sidewall film in the first direction.

2. The device according to claim 1, wherein the insulating sidewall film is a silicon nitride film.

3. The device according to claim 1, wherein the insulating sidewall film is an aluminum oxide film.

4. The device according to claim 1, wherein the insulating sidewall film is a hafnium oxide film.

5. The device according to claim 1, wherein the insulating sidewall film is a hafnium aluminate film.

6. The device according to claim 1, wherein the side wall of the insulating isolation section is formed into a shape of a curved line along the first direction.

7. The device according to claim 1, wherein a pair of the column-shaped sections is connected in a lower part of the stacked body.

8. The device according to claim 1, wherein
the first channel body has an impurity diffusion region provided in a neighborhood of an upper end of the select gate, and
the impurity diffusion region has an impurity concentration higher than an impurity concentration of a lower part of the impurity diffusion region in the first channel body.

9. The device according to claim 1, further comprising:
a second channel body provided in a second hole penetrating the second stacked body and the first stacked body, the first channel body and the second cannel body being arranged in the first direction; and
a second memory film including a second charge storage film provided between the second channel body and a side wall of the second hole,
the insulating sidewall film extending from a first portion between the first memory film and each of the insulating isolation sections to a second portion between the second memory film and each of the insulating isolation sections.

10. The device according to claim 1, wherein the insulating sidewall film is overlapped with the select gate in the planar view taken from the direction vertical to the main face of the substrate.

11. The device according to claim 10, wherein the insulating sidewall film is provided in direct contact with a top face of the select gate.

12. The device according to claim 1, wherein the insulating sidewall film is provided in direct contact with each of the insulating isolation sections.

* * * * *